United States Patent [19]

Pavlin

[11] Patent Number: 4,894,568
[45] Date of Patent: Jan. 16, 1990

[54] GATE CONTROL CIRCUIT FOR A SWITCHING POWER MOS TRANSISTOR

[75] Inventor: Antoine Pavlin, Aix en Provence, France

[73] Assignee: SGS-Thomson Microelectronics S.A., Gentilly, France

[21] Appl. No.: 305,333

[22] Filed: Feb. 2, 1989

[30] Foreign Application Priority Data

Feb. 4, 1988 [FR] France .................. 88 01550

[51] Int. Cl.$^4$ .......................... H03K 17/687
[52] U.S. Cl. ..................... 307/584; 307/570; 307/577; 307/578; 307/446; 307/448
[58] Field of Search ........ 307/584, 570, 571, 573–575, 307/482, 577–578, 446, 448, 246, 304

[56] References Cited

U.S. PATENT DOCUMENTS

| | | | |
|---|---|---|---|
| 3,515,905 | 6/1970 | Raper | 307/570 |
| 3,740,581 | 6/1973 | Pfiffner | 307/304 |
| 4,256,978 | 3/1981 | Pinckaers | 307/584 |
| 4,480,201 | 10/1984 | Jaeschke | 307/570 |
| 4,663,547 | 5/1987 | Baliga et al. | 307/570 |

FOREIGN PATENT DOCUMENTS

| | | |
|---|---|---|
| 1762420 | 4/1970 | Fed. Rep. of Germany . |
| 3405936 | 8/1985 | Fed. Rep. of Germany . |
| 3617610 | 11/1987 | Fed. Rep. of Germany ...... 307/570 |

OTHER PUBLICATIONS

Patent Abstracts of Japan, vol. 10, No. 58.

Primary Examiner—Stanley D. Miller
Assistant Examiner—Nancy Thai
Attorney, Agent, or Firm—Lowe, Price, LeBlanc, Becker & Shur

[57] ABSTRACT

A gate control circuit for a power MOS transistor (1), the first main electrode (D) of which is connected to a high voltage ($V_{CC}$) through a load (L), the second main electrode (S) of which is grounded and the gate (G) of which is connected, during the switching ON period, to a low voltage source ($V_{DD}$), comprises a switch (S1) for connecting at the switching ON of the power MOS transistor its first main electrode to its gate.

5 Claims, 2 Drawing Sheets

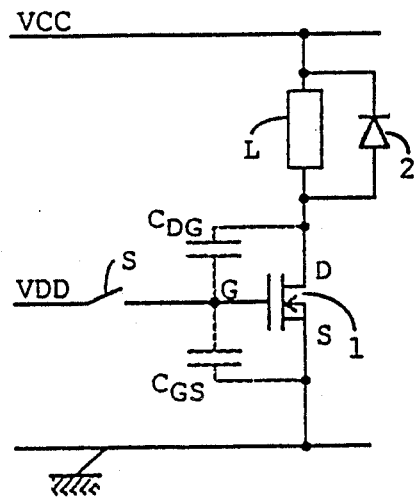
Figure 1A
(PRIOR ART)
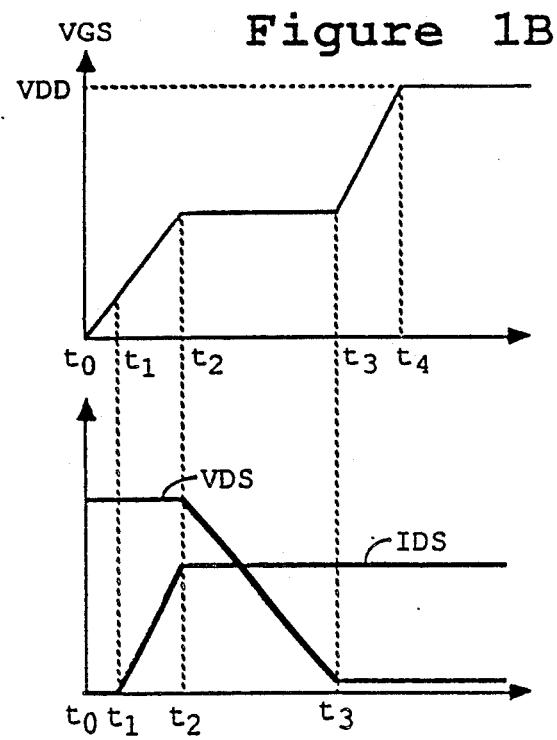
Figure 1B
Figure 1C
(PRIOR ART)
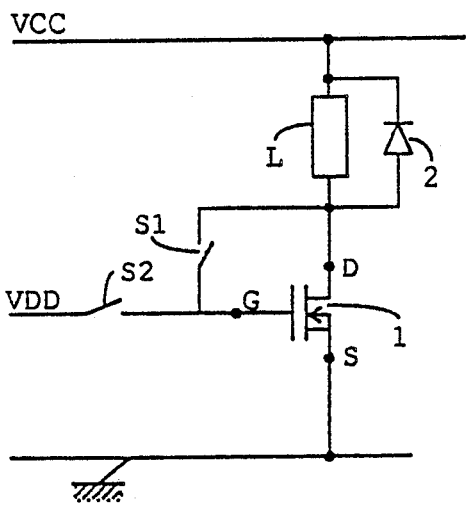
Figure 2
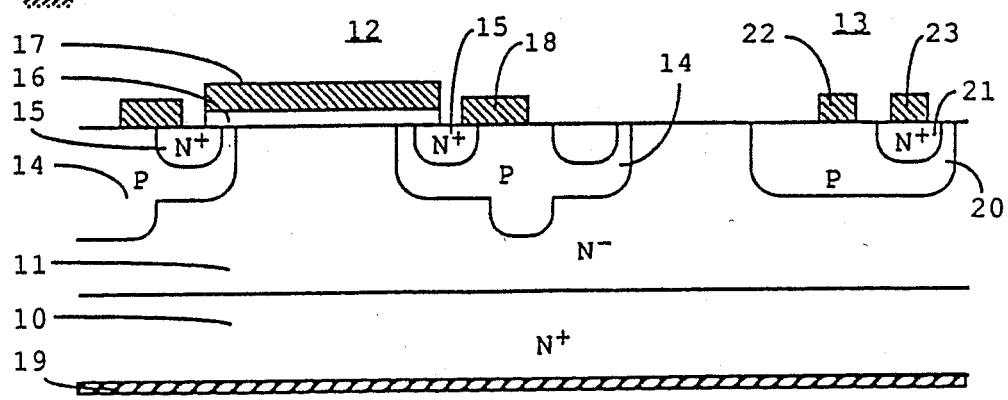
Figure 3

GATE CONTROL CIRCUIT FOR A SWITCHING POWER MOS TRANSISTOR

BACKGROUND OF THE INVENTION

The instant invention relates to gate control circuits for power MOS transistors operating in the switching mode and applies more particularly to so-called VDMOS transistors (vertical diffused MOS) carried out on a substrate at the same time as vertical bipolar transistors.

The instant invention is based on the analysis of the switching ON operation of a power MOS transistor. This analysis will be explained in relation with a simplified connection drawing of a power MOS transistor (FIG. 1A) and operating curves showing the evolution of the gate voltage at the switching ON (FIG. 1B) and the evolution of the drain/source voltage, $V_{DS}$, and of the drain/source current, $I_{DS}$, at the switching ON (FIG. 1C).

FIG. 1A shows a power MOS transistor 1 designed to control the current flow through a load L, a supply voltage $V_{CC}$ (for example 200 volts) being impressed to a terminal of the load L and the other terminal of this load being connected to the drain D of the power MOS transistor 1, the source of which is grounded. The load L is usually an inductive load and a free-wheel diode 2 is shown in parallel with this load. One has also drawn in dotted lines, between the drain and the gate of the MOS transistor, the drain/gate capacitance $C_{DG}$ and between the gate and the source of the MOS transistor the gate/source capacitance $C_{GS}$. A switch S permits to apply a voltage $V_{DD}$ onto the MOS transistor gate, here an N-channel enhancement transistor, for causing its switching ON.

Referring to the curves of FIGS. 1B and 1C, at the switching ON of the switch S, time t0, the voltage on the gate starts increasing until the time t1 when the threshold control voltage of the MOS transistor gate is reached. At that time, the drain/source current starts increasing until a time t2 when the drain/source current reaches the value of the current in the free-wheel diode. Until that time t2, the voltage $V_{DS}$ remains high. Between the times t2 and t3, the capacitance $C_{DG}$ is discharged and the drain/source voltage tends towards a very low value correlated with the ON state resistance, $R_{ON}$, of the DMOS transistor. After the time t3, the gate voltage increases to the full level of the gate voltage source $V_{DD}$ in order to maintain the DMOS transistor in the ON state with a minimum $R_{ON}$ value. Thus, the gate voltage source supplies energy essentially between the times t1t2 and t2-t3 corresponding to the charge of the capacitance $C_{GS}$ and to the discharge of the capacitance $C_{DG}$. By way of example, for a vertical-type DMOS transistor fed under 200 volts, having a switching ON resistance of 0.18 volt, the total gate charge required is typically 40 nanocoulombs. If the switching is carried out in 100 ns, the peak current to be supplied to the DMOS transistor gate is 400 milliamperes. For some implementations, this current dissipation can be excessive.

Thus, the instant invention is based on this analysis and on the fact that the voltage $V_{DS}$ on the MOS transistor drain remains substantially higher than $V_{DD}$ virtually until the time t3, as shown in FIG. 1C.

SUMMARY OF THE INVENTION

Thus, the instant invention provides, during the switching ON phase, to draw the gate charge current of the DMOS transistor from its drain as long as the drain voltage is higher than the gate voltage, in order to avoid the gate energy consumption. A further advantage of the invention is to accelerate the switching, due to the fact that, the drain voltage being substantially higher than the supply voltage of the gate, $V_{DD}$, the gate/source and gate/drain capacitances will be more rapidly charged and discharged, respectively.

Thus, the instant invention provides fora control circuit for a power MOS transistor gate, the first main electrode of which is connected to a high voltage through a load, the second main electrode of which is grounded and the gate of which is connected, during the switching ON period, to a low voltage source, comprising means for connecting at the switching ON of the power MOS transistor its first main electrode to its gate.

BRIEF DESCRIPTION OF THE DRAWINGS

Those objects, features, advantages and others of the instant invention will clearly appear from the following detailed description of preferred embodiments, in connection with the attached drawings, wherein:

FIGS. 1A, 1B and 1C have been described hereinabove to illustrate the prior art and the problem the instant invention aims at solving;

FIG. 2 very schematically shows a circuit according to the invention;

FIG. 3 shows a structure associating VDMOS transistors with vertical bipolar transistors;

DETAILED DESCRIPTION OF THE DRAWINGS

Figure 4:
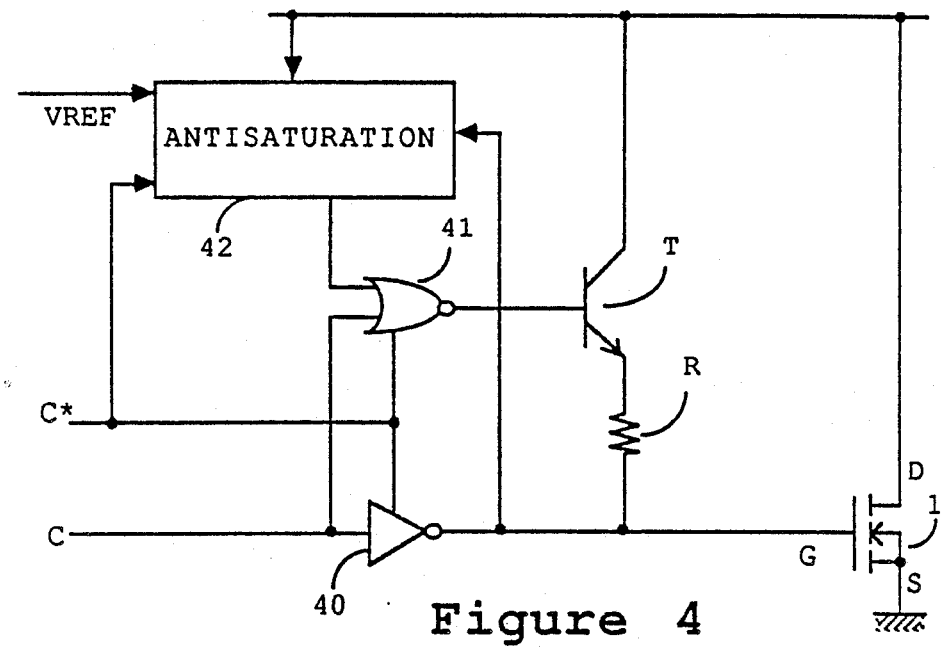
FIG. 4 shows an embodiment of a gate control circuit according to the invention.

FIG. 2 very schematically shows a circuit according to the instant invention. The MOS transistor 1, the load L, and the free-wheel diode 2 already illustrated in FIG. 1 are again shown in this figure. Moreover, the circuit according to the invention comprises a first switch S1 between the drain and the gate of the MOS transistor 1 and a second switch S2 between the voltage $V_{DD}$ and the gate of transistor 1, this switch S2 corresponding to the switch S of FIG. 1A.

According to the instant invention, it is proposed, when it is desirable to switch on the MOS transistor 1, to simultaneously switch on the switches S1 and S2. Thus, the gate charging current is drawn through the load on the transistor drain. As soon as the drain voltage approaches the voltage $V_G$, the switch S1 is switched off, the switch S2 being maintained on for maintaining an optimal conduction voltage on the MOS transistor gate. Thus, the quantity of current drawn from the gate voltage source $V_{DD}$ is substantially reduced, the energy being mainly drawn from the main supply voltage $V_{CC}$. On the other hand, the switching ON period is reduced, the gate capacitances being charged under a higher voltage.

A preferred embodiment of the instant invention will be described in more detail when the MOS transistor 1 is a vertical diffused-type power MOS transistor (VDMOS) realized according to a technology compatible with the simultaneous construction of vertical bipolar transistors on a same substrate. A side view of such a structure is very schematically illustrated by way of example in FIG. 3 wherein it will be noted that the various layer thicknesses and lateral sizes of the various areas are not drawn to scale but are simply intended for the sake of illustration.

In FIG. 3, a substrate comprising an N+-type lower layer or rear face 10 and an N--type upper layer 11 is considered. In this substrate, on the one hand, at least one VDMOS transistor 12 and, on the other hand, at least one vertical bipolar transistor 13 are formed.

The VDMOS transistor comprises diffused P-type areas 14 wherein N+-type source regions 15 are formed. Between the limits of two areas 14, an insulating layer 16 and a gate conductive layer 17 are formed on the substrate surface. On the N+-type regions 15 source metallizations 18 are formed. The layer 10 corresponds to the drain of the vertical MOS transistor and is coated with a rear face metallization 19. Thus, when a voltage is applied onto the gate 17 of the VDMOS transistor, the surface parts of the P-type regions 14 are submitted to an inversion of the type of polarity and a conduction is established between the source metallizations 18 and the drain metallization 19.

The bipolar transistor 13 comprises a P-type base region 20 simultaneously formed with the regions 14 of the VDMOS transistor and an N+-type emitter region 21 simultaneously formed with the source regions 15. The base region 20 is coated with a base metallization 22 and the emitter region 21 is coated with an emitter metallization 23. The collector of this bipolar transistor also corresponds to the substrate 10, 11 and to the metallization 19.

Thus, this technology provides for vertical VDMOS transistors and bipolar transistors, the drain and collector electrodes of which are systematically interconnected. A further advantage of this technology is that it is possible to simultaneously construct lateral MOS transistors for realizing logic circuits.

FIG. 4 shows an examplary simplified circuit according to the instant invention associating a VDMOS transistor 1 that it is desired to switch with a vertical bipolar transistor T having the function of switch S1 of FIG. 2. The transistor T is connected between the drain D and the gate G of the VDMOS transistor 1, in series with a limiting resistor R. A control signal C is applied, on the one hand, onto the gate of the VDMOS 1 through an inverter 40, and, on the other hand, onto a first input of a NOR gate 41, the second input of which originates from a logic circuit 42. This logic circuit 42 is so designed that the NOR gate is switched ON at the same time as the inverter 40 as soon as the control signal C is set to "0". The charging of the gate is therefore obtained through the switching ON of the bipolar transistor T as soon as the signal C is applied. On the other hand, the logic circuit 42 comprises means for comparing the gate voltage of the VDMOS transistor with a reference voltage $V_{REF}$ in order to invalidate the NOR gate 41 and therefore to interrupt the conduction of the transistor T as soon as the voltage on the terminal G of the VDMOS transistor is approaching the voltage $V_{DS}$ of the VDMOS transistor 1.

In addition to the control signal C, the reverse signal C* is also supplied in order to reduce the current dissipation during the OFF state. Those signals C and C* are liable to be conventionally supplied from a Schmitt trigger. In order to obtain this consumption reduction, the inverter 40 and the NOR gate 41 are bootstrap circuits.

Figure 5:
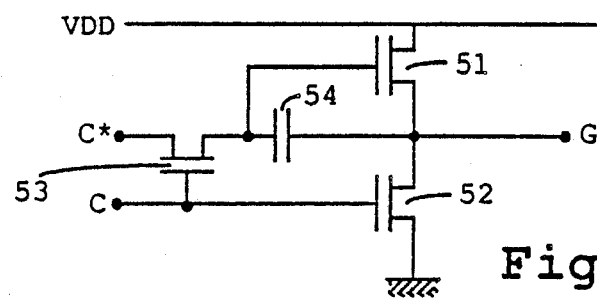
FIG. 5 shows an exemplary bootstrap inverter circuit.

Bootstrap circuits are known in the art. An exemplary boostrap inverter is shown in FIG. 5. This circuit comprises between the gate supply voltage $V_{DD}$ and the ground two logic MOS transistors in series 51 and 52. The transistor 52 receives the control signal C and the transistor 51 receives the control signal C* through a switch 53. A bootstrap capacitor 54 is connected between the gate and the source of the MOS transistor 51; as a result, at the time when the control signal C is set to "0", the gate voltage of the transistor 51 is at a value equal to 2 $V_{DD}$. As it is known, such circuits permit to supply a maximal output current at the switching time while dissipating a minimal current in the OFF state.

Referring back to the circuit in FIG. 4, as hereinabove mentioned, when the signal C is set to "0", the output of the bootstrap NOR gate is set from "0" to "1" and starts supplying a base current to the bipolar transistor T, for example a current of about 2mA. The current gain of the bipolar transistor supplies about 400 mA to the VDMOS transistor gate from the high voltage present on the common drain/collector terminal through the emitter resistor R which can for example have a value of 18 ohms. At the same time, the signal C* is supplied to the logic circuit 42 to force its output towards the NOR gate 41 to "0". When the drain current of the VDMOS transistor 1 reaches its maximal value, the gate voltage reaches and keeps a value $V_{GS}=VT+I_{DS}/gm$ where VT is the threshold voltage of this VDMOS transistor and gm is its transconductance, the value of $V_{GS}$ is conventionally about 4 volts. The VDMOS drain voltage then starts to decrease.

Figure 6:
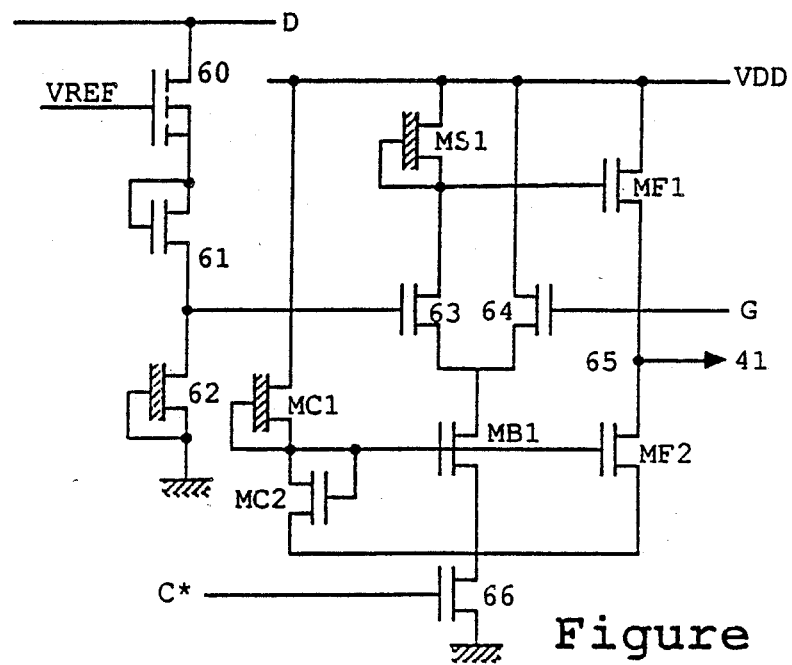
FIG. 6 shows an exemplary antisaturation circuit adapted to the implementation of the invention.

FIG. 6 shows an exemplary logic circuit 42 permitting to detect this drain voltage drop. This circuit comprises a voltage divider comprising in series between the drain terminal D and the ground a VDMOS transistor 60, the gate of which receives the reference voltage, an enhancement MOS transistor 61, the gate of which is connected to its drain, and a depleted MOS transistor 62, the gate of which is connected to its source. The voltage at the drain/source connection point of the transistors 61 and 62 is supplied by a comparator essentially comprising the MOS transistors 63 and 64, the gate of the transistor 63 receiving the voltage on the connection point of the transistors 61 and 62 and the gate of the transistor 64 receiving the voltage on the terminal G (gate of the power VDMOS transistor 1). The output of the circuit towards the second input of the NOR gate 41 is drawn from a terminal 65. The other components of this circuit are conventional. It will be noted in this figure that the depleted MOS transistors are shown, as for transistor 62, with hatched lines drawn between the two vertical lines. it will also be noted that the signal C* supplied on a MOS transistor 66 permits to inhibit the operation of the comparator and therefore to avoid any current consumption as long as the control signal C is set to "1". Thus, the comparator 63, 64 compares the gate voltage of the power VDMOS transistor with a voltage equal to $V_{DS}$-δV-VT where $V_{DS}$ is the drain voltage of the DMOS, δV is the voltage drop at the terminals of the logic MOS transistors 61 and 62 and VT is the threshold voltage of the VDMOS transistor 60. Thus, the logic circuit 42 is switched as soon as $V_{GS}$ becomes higher than $V_{DS}$-δV-VT. At this stage, the drain voltage of the VDMOS transistor has been switched from an initial high voltage to about 12 volts. The emitter voltage of the bipolar transistor is then about 10 volts. Thus, the NOR gate 41 turns OFF the base current of the bipolar transistor while the latter is in a quasi-saturation state with a collector/emitter voltage drop of about 2 volts. Preventing the bipolar transistor from reaching a full saturation state ensures a rapid discharge of the latter and its switching off before the switching off of the VDMOS transistor and the increase of the drain/collector voltage. Under those conditions, the bipolar transistor is liable to be used up to its collector/emitter breakdown voltage which is equal to the drain/source breakdown voltage of the VDMOS transistor owing to the technology used, illustrated in FIG. 3.

Of course, the hereinabove described circuits constitute only one embodiment of the invention and are liable to be submitted to various variations, in particular as regards the details of the bootstrap circuit and of the logic circuit 42 which could be realized with other logic components in accordance with the manufacturing technologies of the VDMOS transistor.

I claim:

1. A gate control circuit for a power MOS transistor (1), the first main electrode of which (D) is connected to a high current voltage ($V_{CC}$) through a load (L), the second main electrode of which (S) is grounded and the gate (G) of which is connected, during the switching ON period, to a low voltage source ($V_{DD}$), comprising switching means (S1) for connecting, at the switching ON of said power MOS transistor, said first main electrode to said gate.

2. A gate control circuit according to claim 1, wherein the power MOS transistor (1) is a VDMOS-type realized in a semiconductor substrate where a vertical bipolar transistor (T) is also formed, the rear face of the substrate corresponding to the VDMOS drain and to the bipolar transistor collector, said drain (D) constituting said first main electrode, wherein the bipolar transistor emitter is connected to the VDMOS transistor gate and wherein its base receives the switching ON signal (C) at the same time as the VDMOS gate.

3. A gate control circuit according to claim 2, wherein said emitter is connected to said gate through a resistor (R).

4. A gate control circuit according to claim 2, comprising means (42 ; 63, 64) for blocking the conduction of the bipolar transistor as soon as the drain voltage of the VDMOS is approaching its gate voltage.

5. A gate control circuit according to claim 2, wherein the voltages of the VDMOS gate and of the bipolar transistor base are supplied through bootstrap logic circuits (40, 41) in response to a control signal.

* * * * *